(12) United States Patent
Applegarth et al.

(10) Patent No.: US 12,239,935 B2
(45) Date of Patent: Mar. 4, 2025

(54) METHODS AND SYSTEMS FOR ADSORBING ORGANOMETALLIC VAPOR

(71) Applicant: ENTEGRIS, INC., Billerica, MA (US)

(72) Inventors: Charles H. Applegarth, San Luis Obispo, CA (US); Rocky D. Gipson, Arroyo Grande, CA (US); Sarah Vogt, Grover Beach, CA (US); Joshua T. Cook, San Diego, CA (US); Matthew Browning, San Luis Obispo, CA (US); Marco Holzner, Morro Bay, CA (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 18/228,298

(22) Filed: Jul. 31, 2023

(65) Prior Publication Data
US 2023/0405510 A1    Dec. 21, 2023

Related U.S. Application Data

(62) Division of application No. 16/879,514, filed on May 20, 2020, now Pat. No. 11,712,653.

(60) Provisional application No. 62/852,506, filed on May 24, 2019.

(51) Int. Cl.
| | |
|---|---|
| *B01D 53/04* | (2006.01) |
| *B01J 20/08* | (2006.01) |
| *B01J 20/10* | (2006.01) |
| *B01J 20/20* | (2006.01) |
| *B01J 20/28* | (2006.01) |

(52) U.S. Cl.
CPC .......... *B01D 53/0438* (2013.01); *B01J 20/08* (2013.01); *B01J 20/103* (2013.01); *B01J 20/20* (2013.01); *B01J 20/28061* (2013.01); *B01J 20/28064* (2013.01); *B01J 20/28066* (2013.01); *B01J 20/2808* (2013.01); *B01D 2253/102* (2013.01); *B01D 2253/104* (2013.01); *B01D 2253/108* (2013.01); *B01D 2253/306* (2013.01); *B01D 2253/308* (2013.01); *B01D 2257/706* (2013.01)

(58) Field of Classification Search
CPC ................ B01D 53/04; B01D 53/0407; B01D 53/0438; B01J 20/08; B01J 20/103; B01J 20/20
See application file for complete search history.

(56) References Cited

U.S. PATENT DOCUMENTS

| | | | |
|---|---|---|---|
| 1,398,205 A | 11/1921 | Sirch | |
| 5,581,903 A | 12/1996 | Botich | |
| 5,704,965 A | 1/1998 | Tom et al. | |
| 5,744,420 A * | 4/1998 | Le Loarer | C08F 6/02 502/355 |
| 5,980,608 A | 11/1999 | Dietz et al. | |
| 6,132,492 A | 10/2000 | Hultquist et al. | |
| 6,749,671 B2 | 6/2004 | Holst et al. | |

(Continued)

FOREIGN PATENT DOCUMENTS

| | | |
|---|---|---|
| CN | 202893187 U | 4/2013 |
| CN | 203693103 U | 7/2014 |

(Continued)

*Primary Examiner* — Sharon Pregler

(57) ABSTRACT

Described are methods, devices, and systems useful for adsorbing organometallic vapor onto solid adsorbent material to remove the organometallic vapor from a gas mixture that contains the organometallic vapor and other vapor, particulate materials, or both.

13 Claims, 7 Drawing Sheets

(56) References Cited

U.S. PATENT DOCUMENTS

| | | | |
|---|---|---|---|
| 6,749,819 B2 * | 6/2004 | Otsuka | C01C 1/024 423/230 |
| 8,409,895 B2 | 4/2013 | Zhu et al. | |
| 8,889,090 B2 * | 11/2014 | Izaki | C01C 1/12 423/248 |
| 9,211,493 B2 | 12/2015 | Applegarth et al. | |
| 9,944,575 B2 | 4/2018 | Kawashima et al. | |
| 2003/0056726 A1 | 3/2003 | Holst et al. | |
| 2006/0011064 A1 | 1/2006 | Carruthers | |
| 2011/0232493 A1 | 9/2011 | Yeganeh et al. | |
| 2012/0180657 A1 | 7/2012 | Monereau et al. | |
| 2014/0013942 A1 | 1/2014 | Wójtowicz et al. | |
| 2014/0322124 A1 | 10/2014 | Izaki et al. | |
| 2019/0366260 A1 | 12/2019 | Wang et al. | |

FOREIGN PATENT DOCUMENTS

| | | |
|---|---|---|
| CN | 108658042 B | 11/2019 |
| JP | H0291192 A | 3/1990 |
| JP | H07323211 A | 12/1995 |
| JP | H10238422 A | 9/1998 |
| JP | 2001353420 A | 12/2001 |
| JP | 2008013406 A | 1/2008 |
| JP | 2017164683 A | 9/2017 |
| KR | 101211625 B1 | 12/2012 |
| WO | 9007971 A1 | 7/1990 |
| WO | 0129281 A1 | 4/2001 |
| WO | 2006034540 A1 | 4/2006 |
| WO | 2006057748 A2 | 6/2006 |

* cited by examiner

METHODS AND SYSTEMS FOR ADSORBING ORGANOMETALLIC VAPOR

CROSS-REFERENCE TO RELATED APPLICATIONS

This application is a divisional application of U.S. patent application Ser. No. 16/879,514, filed May 20, 2020, which claims the benefit under 35 USC 119 of U.S. Provisional Patent Application No. 62/852,506, filed May 24, 2019. The disclosure of each of the above-referenced applications are hereby incorporated herein by reference in their entirety for all purposes.

FIELD OF THE INVENTION

The invention relates to methods, devices, and systems useful for adsorbing organometallic vapor onto a solid adsorbent material to remove the organometallic vapor from a gas mixture that contains the organometallic vapor and other vapor, particulate materials, or both.

BACKGROUND

In chemical processing industries, organometallic compounds that contain a metal atom bonded to an organic group are used as raw materials, for example for preparing nitride materials (e.g., gallium nitrides) that function as light emitting devices (LEDs). The ability to safely store and deliver organometallic compounds for use as needed in a chemical process is an essential requirement for these chemical materials to be safely and reliable available for use. Systems and methods for storing and delivering certain types of organometallic compounds for use in a chemical process are described in U.S. Pat. Nos. 5,518,528, 5,704,965, and 6,132,492, 6,749,671. Sequestering of unused organometallics, either in gaseous or particulate form in the effluent of these processes, is likewise essential. Removal of these species from effluent streams serves to comply with regulatory requirements, enables potential reuse of process gases, and provides continual operation of processes.

SUMMARY

Organometallic compounds are used in various industrial processes, including for example deposition processes such as in the formation of gallium nitride (GaN) via metal-organic chemical vapor deposition (MOCVD). Examples of useful raw materials for depositing gallium nitride include an organometallic compound such as trimethyl gallium, trimethyl indium, or trimethyl aluminum, in combination with a source of nitrogen, which is commonly ammonia ($NH_3$). The deposition process produces a gaseous exhaust stream that contains the unreacted vapor phase organometallic compound (e.g., trimethyl gallium) along with non-organometallic materials such as gaseous nitrogen ($N_2$), gaseous hydrogen ($H_2$), gaseous ammonia ($NH_3$), or a combination of these. Additionally, particles such as organometallic micro-particles and their corresponding metal-oxides and -hydroxides (due to reaction with intrinsic moisture and oxygen) are exhausted.

Organometallic particles that are part of an exhaust stream may desirably be removed from gaseous components of the exhaust stream. For example, some gaseous materials of an exhaust stream such as ammonia may be desirably processed for re-use, i.e., recycled. To re-use the ammonia, organometallic particles must be removed from the exhaust stream to a high level of purity of the ammonia. This is important so that the purified ammonia is useful in an application requiring a very high level of purity (e.g., in semiconductor manufacturing), but is also important because organometallic particles can produce processing difficulties in a recycling process and system. Organometallic particles have the potential to clog equipment that is used for separating gaseous components of an exhaust stream. As one example, a separation system may include mechanical valves that will not properly close and seal properly if organometallic particles accumulate on surfaces of the valves. Another concern is that organometallic particles can disrupt the performance of (e.g., clog) filters (e.g., molecular sieves) used to separate or remove gaseous components from an exhaust stream.

Disclosed herein are novel and inventive methods, systems, and devices that can be useful for removing organometallic vapor from a gas mixture. The gas mixture can be an effluent of a process for depositing a gallium nitride material onto a substrate to form an LED specifically. Alternatively, the gas mixture may be an effluent from any other deposition or chemical process or may be useful as an input or a raw material for a chemical process.

In one aspect disclosed herein is a method of removing organometallic vapor from a gas mixture that contains the organometallic vapor and non-organometallic vapor. The method includes passing the gas mixture through solid adsorbent and adsorbing the organometallic vapor onto the solid adsorbent.

In another aspect disclosed herein is a method of filtering a heated gas mixture that contains organometallic vapor, particles, and non-organometallic vapor. The method includes reducing a temperature of the heated gas mixture by passing the heated gas mixture through a heat exchanger to produce a cooled gas mixture; passing the cooled gas mixture through a particle filter to remove particles; and passing the cooled gas mixture through solid adsorbent to adsorb organometallic vapor onto the adsorbent.

In yet another aspect disclosed herein is a system for filtering a heated gas mixture that contains organometallic vapor, particles, and non-organometallic vapor. The system includes a heat exchanger, a particle filter, and a solid adsorbent arranged to allow flow of the heated gas mixture through the heat exchanger to cool the heated gas mixture, through the particle filter, and through the solid adsorbent.

BRIEF DESCRIPTION OF THE FIGURES

The disclosure may be more completely understood in consideration of the following description of various illustrative embodiments in connection with the accompanying figures.

Figure 1:
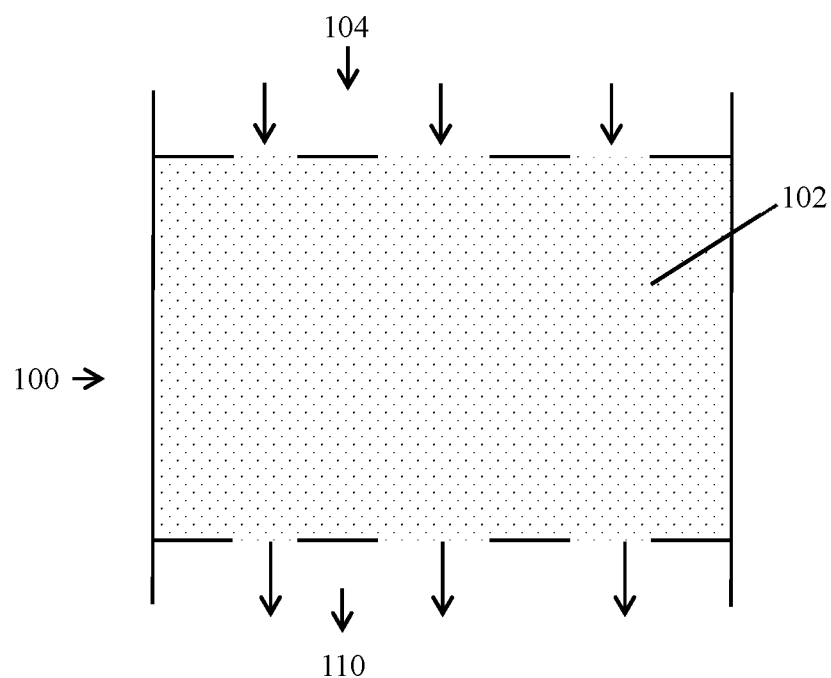
FIG. 1 shows an example of a filter device and a related method as described that uses solid adsorbent to remove organometallic vapor from a gas mixture.

All figures are exemplary, schematic, and not necessarily to scale.

DETAILED DESCRIPTION

The following is a description of methods, systems, devices, and combinations of devices that are useful for adsorbing organometallic vapor from a gas mixture, onto solid adsorbent, to remove the organometallic vapor from the gas mixture.

The gas mixture can be a combination of organometallic vapor, additional vapor that is not an organometallic compound (referred to as non-organometallic vapor), and other optionally-present materials such as suspended micro-particles (including micro-particles, sub-micron particles, nanoparticles, etc.). The gas mixture can be one that is useful in or is derived from any chemical or physical process that involves use or production of organometallic vapor as part of a gas mixture, e.g., as a raw material or as an effluent. The organometallic vapor can be present in a relatively low or even a trace amount, for example below 10 percent (by volume), or below 3, 2, 1, or 0.5 percent by volume of the gas mixture. Certain exemplary gas mixtures that contain organometallic vapor can also contain ammonia in gaseous (vapor) form, such as at least 15, 20, 30, or 40 percent (volume) ammonia. Certain specific gas mixtures that can be processed by methods of the present description to remove organometallic vapor are in the form of heated exhaust streams that contain organometallic vapor in combination with ammonia vapor. The gas mixture may also contain, e.g., hydrogen, nitrogen, and micro-particles, and may be a gas mixture that is derived from a flow of a heated exhaust gas that has previously been processed by cooling, filtering (to remove particles), or both.

In the present description, the term "vapor" is used in a manner that is consistent with the use of this term in chemical processing technologies, and refers to a chemical material that exists in molecular form in a gaseous state, e.g., an organometallic vapor is an organometallic compound that exists in a gas mixture in molecular form.

The organometallic vapor can be an organometallic compound that contains a metal atom bonded (e.g., covalently bonded) to one or more organic moieties (also sometimes referred to as an "organyl group"), i.e., the organometallic compound includes at least one carbon-to-metal bond between a metal atom and an organic moiety. The metal may be any metal, such as an alkali metal, alkaline earth metal, or a transition metal. Example metals include aluminum, gallium, antimony, titanium, cobalt, tungsten, and indium. The organic moiety may be any organic group capable of forming a carbon-metal covalent bond, such as: alkyl (e.g., methyl, ethyl, propyl, etc.), aryl, alkylsilyl, alkylboryl, carbonyl, and cyano. These groups may be linear, branched, or cyclic, may contain unsaturation such as a carbon-carbon double bond or an aromatic ring structure, and may optionally contain one or more heteroatoms or hydrogen substitution.

Non-limiting examples of organometallic compounds that are part of a gas mixture as organometallic vapor, with the organometallic vapor being one that can be effectively adsorbed by solid adsorbent to remove the organometallic vapor from the gas mixture, include organometallic compounds having, as the metal, a transition metal such as gallium, aluminum, indium, etc. The metal is associated with one or more organic residues, which may be, e.g., an alkyl group. For a metal atom that is associated with more than one organic residue, the two or more organic residues may be the same or different. Specific examples of such organometallic compounds include trimethyl gallium, trimethyl indium, and trimethyl aluminum, and trimethyl antimony ($(CH_3)_3Sb$).

Example organometallic compounds can also be chemical derivatives of any of these or other organometallic compounds. An organometallic compound may react with another gaseous chemical present during a process (e.g., a deposition), for example with gaseous nitrogen, oxygen, water, or hydrogen, to form a derivative oxide, salt, metal oxide, hydroxide, or the like.

The gas mixture can also contain one or more additional types of vapor that are not organometallic compounds, i.e., that are non-organometallic vapor. These may be gases of an upstream process that are present as a reactant or are produced as a reaction product. Examples can include common vapors present in industrial chemical processes such as nitrogen vapor ($N_2$), hydrogen vapor ($H_2$), water vapor ($H_2O$), ammonia ($NH_3$), oxygen ($O_2$), carbon dioxide ($CO_2$). One or more of the non-organometallic vapors may be of a type that can be desirably collected in a subsequent step, for example for re-use and to avoid the need for disposal. An example of one such vapor is ammonia. In these instances, the non-organometallic vapor preferably does not become adsorbed onto the solid adsorbent when the gas mixture contacts the solid adsorbent.

The gas mixture can also contain non-vapor materials such as suspended solid particles that are larger than molecules of a vapor. Example particles can be greater than 10 microns. Other particles can be solid particles referred to as "micro-particles" having a particle size below 10 microns, which also includes sub-micron-sized particles, e.g., particles having a size of below 1 micron including below 0.5 micron and down to about 0.1 micron. These types of particles may be derived from agglomeration of reactants or reaction products of a chemical process, from intrusion of moisture or oxygen, or from equipment or other solid materials involved in delivering or controlling a chemical process or chemical process environment. Examples of particles that may be contained in a gas mixture include organometallic micro-particles that are made of organometallic compounds as described herein with respect to the organometallic vapor, or metal-containing hydroxide or oxide by-products.

During adsorption of the organometallic vapor onto the solid adsorbent, the gas mixture and solid adsorbent may each independently be at a temperature that allows effective and efficient adsorption of the organometallic vapor onto the adsorbent. The temperature should not be excessively high such that adsorption is unduly hindered. A non-limiting example of a useful temperature range can be from 0 to 50 degrees Celsius.

Likewise, the gas mixture may be presented to the solid adsorbent at a pressure that allows a high amount of adsorption of the organometallic vapor onto the solid adsorbent, i.e., efficient removal of much or most of the amount of organometallic vapor present in a gas stream. A useful pressure of the gas mixture can be one that is common or typical for efficiently moving a continuous flow of gaseous fluid through or from an industrial chemical process, e.g., as part of or derived from an exhaust stream, and that is considered to be non-pressurized, meaning at about ambient pressure conditions. The flow can be one that is considered a "forced" flow of gaseous fluid driven by a mechanical force such as that produced by vacuum or an impeller (e.g., fan), but that is not driven by or subjected to a pressure produced by a compressor or reduced temperature. A pressure commonly used for such non-pressurized or "ambient"-pressure industrial gas flow processes can be below 2 atmospheres (gauge), e.g., below 1.5 or 1.3 atmosphere (gauge), and is referred to herein as an "ambient flow pressure."

The processing conditions for contacting the gas mixture with the solid adsorbent can be effective to efficiently remove a large amount of organometallic vapor from a gas stream in a continuous or semi-continuous fashion. The solid adsorbent and process conditions can result in efficient removal of a large amount of the organometallic vapor from the gas mixture. For example, an amount of organometallic vapor removed from a gas stream upon contacting the gas stream with solid adsorbent (e.g., by passing the gas stream through a bed of solid adsorbent as shown in FIG. 1) can be at least 90, 95, 99, or at least 99.9 or 99.99 percent of the organometallic vapor originally present in the gas stream.

The solid adsorbent is a material that is generally granular, e.g., in particle form, porous, and with the particles being made of material that is effective to adsorb a contaminant such as organometallic compound. Various types of solid adsorbent materials are known and commercially available. Some examples include cation exchange resins, anion exchange resins, aluminas, silicas, zeolites, metal oxides, salts, activated carbon (natural and synthetic), chemically coated carbons, and chemically coated polymers, any of which may be provided in the form of porous particles. Any of these or other filter media can also include a chemical treatment, e.g., coating, that will improve the adsorptive properties of the filter media, for example, to improve adsorption of one or more general or specific types of organometallic vapor.

An example of a useful solid adsorbent is activated carbon, which is generally known as a highly porous adsorptive material that has a complex structure composed primarily of carbon atoms. Activated carbon can be in the form of granular particles that include a network of pores that are present within a rigid matrix of disordered layers of carbon atoms, linked together by chemical bonds, stacked unevenly, creating a highly porous structure of nooks, crannies, cracks and crevices between the carbon layers. Different varieties of activated carbon include granular activated carbon, powdered activated carbon, and extruded carbon.

One type of zeolite is sometimes described as a microporous crystalline aluminosilicate of alkali or alkaline earth elements represented as:

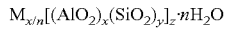

$$M_{x/n}[(AlO_2)_x(SiO_2)_y]_z \cdot nH_2O$$

where x and y are integers with y/x being equal to or greater than 1, n is the valence of the cation M and z is the number of water molecules in each unit cell.

A solid adsorbent can be characterized by surface area. Useful or preferred solid adsorbent materials for use in a method as described can have a surface area in a range from 100 to 1500 square meters per gram ($m^2/g$). A useful or preferred surface can be different based on the type of adsorbent. For example, a surface area for an activated carbon adsorbent may preferably be in a range from 1000 to 1500, e.g., from 1200 to 1300 square meters per gram. A surface area for a zeolite adsorbent may be in a range from 100 to 200 square meters per gram. Surface area of a solid adsorbent can be measured by known techniques, such as by BET nitrogen adsorption techniques.

A useful adsorbent can have properties of pore size and pore volume that are also useful, for example an average pore size of below 150 angstroms, such as below 100, 50, 15, or angstroms, e.g., from 3 to 8 angstroms.

Referring now to FIG. 1, illustrated is a schematic view of a method of removing gaseous organometallic vapor from a gas mixture flow that contains the organometallic vapor, by adsorbing the organometallic vapor onto solid adsorbent. Filter 100 includes bed 102 of solid adsorbent particles as described herein, e.g., activated carbon, zeolite, or the like. Gas mixture 104, which contains organometallic vapor, non-organometallic vapor, and optional particles (e.g., micro-particles, sub-micron particles, or the like), flows from an upstream source or process. Gas mixture 104 may be a raw material to be filtered and delivered to a chemical process, or may be an exhaust or effluent produced by an upstream chemical process. Gas mixture 104 flows into an inlet of filter 100 on an upstream side of bed 102, flows through bed 102, and then exits filter 100 on an opposite (downstream) side of bed 102 as filtered gas mixture 110, containing a reduced amount of the organometallic vapor. The temperature and pressure of gas mixture 102 and 104 are as described herein, including these flows being at a condition of an ambient flow pressure.

A rate and volume of flow (e.g., flux), and a pressure of the flow of gas mixture 104, are effective to allow gas mixture 104 to reside within bed 102 for a time that will allow for a majority, most, or substantially all of the organometallic vapor present in gas mixture 104 to be removed from the gas mixture to produce filtered gas mixture 110. For example, gas mixture 110 can contain less than 1, 0.1, or 0.01 percent (by volume or by mass) of the total amount of organometallic vapor originally contained in gas mixture 104. Other vapor or vapors (non-organometallic vapors such as hydrogen, nitrogen, ammonia) present in gas stream 104 will pass substantially through bed 102 and not become adsorbed onto the solid adsorbent particles of bed 102, and will exit filter 100 as vapor contained in gas mixture 110; e.g., at least 95, 99, or 99.5 percent (by volume or by mass) of a non-organometallic vapor may pass through bed 102.

Figure 2:
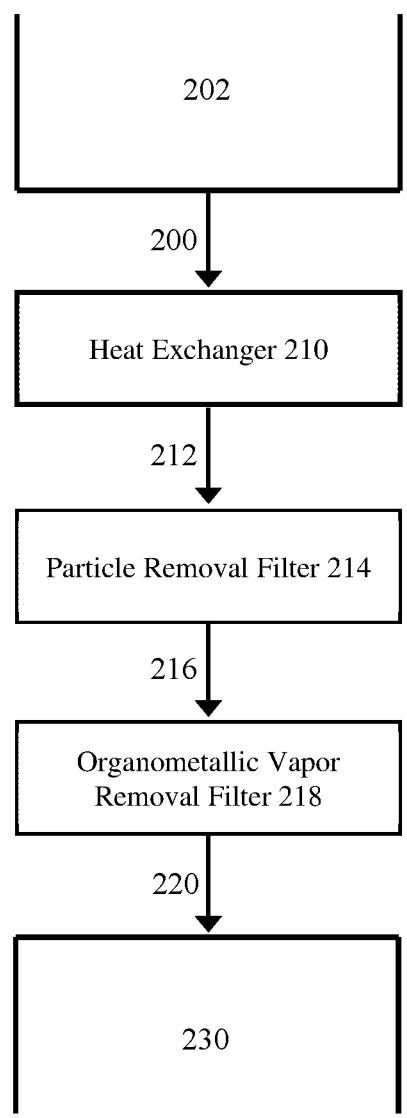
FIG. 2 shows an example of a system or a set of devices or method steps as described, that include using solid adsorbent to remove organometallic vapor from a gas mixture.

FIG. 2 shows one specific example of a multi-stage system and method useful to process a gas mixture (e.g., a heated gas mixture or "exhaust" stream) by reducing the temperature of the gas mixture, removing organometallic vapor from the gas mixture, and removing particles from the gas mixture (not necessarily in any particular order).

As illustrated, process 202 is an industrial process that produces gas mixture 200. Process 202 may be any commercial process, and in particular embodiments of the present description can be a process of producing light emitting devices (LEDs). This type of process is known to require very large volumes of high purity gases, including ammonia. An important and high-cost feature of the process is the growth of active semiconducting layers by epitaxial deposition, which can be performed by metal-organic chemical vapor deposition (MOCVD). The step of MOCVD creates metal-nitride compounds such as indium gallium nitride (InGaN) from volatile metal-organic precursors such as trimethyl gallium, also in combination with a source of nitrogen such as ammonia. The multilayer LED structures are deposited onto a substrate, which is typically sapphire.

Very high purity raw materials are required for performing this type of LED manufacturing process. One of these raw materials is the ammonia, which, unfortunately, is not used efficiently in MOCVD processes and is present in a substantial amount in an exhaust stream produced by the process. That exhaust stream is a heated gas mixture that contains a substantial amount of ammonia, metal-containing precursors (organometallic vapor) such as trimethyl gallium precursors or chemical derivatives thereof, non-organometallic vapors such as hydrogen ($H_2$) and nitrogen ($N_2$) and, possibly, solid particles such as organometallic particles. Examples of this type of gas mixture, produced as an exhaust gas from a metal-organic chemical vapor deposition step for producing a metal-nitride compound of an LED structure, can have amounts of ammonia vapor, hydrogen vapor, and nitrogen vapor, as follows: from 15 to 40 volume percent ammonia vapor, from 0 to 60 volume percent hydrogen vapor, and from 0 to 70 volume percent nitrogen vapor; e.g., from 15 to 35 volume percent ammonia vapor, from 5 to 50 volume percent hydrogen vapor, and from 5 to 60 volume percent nitrogen vapor.

The gas mixture will also contain an amount of organometallic vapor (e.g., trimethyl gallium or derivatives thereof) and an amount of solid particles (e.g., microparticles, sub-micron particles, or the like). The exhaust will flow from the MOCVD process at an elevated temperature, which will depend on factors such as the distance from the reactor (deposition chamber) and whether the exhaust has been processed by a cooling step to reduce the temperature. A temperature of an exhaust leaving a reactor can approximate the temperature of the reactor, which may be as high as 500 degrees Celsius. After leaving the reactor the temperature may fall or be reduced by a cooling step but may remain at an elevated temperature of at least 50, 60, 70, or 80 degrees Celsius, and an ambient flow pressure, when initially processed by a system or device (e.g., heat exchanger) of the present description.

Desirably, to reduce cost and waste, the ammonia contained in this type of heated exhaust can be collected and re-used, but first the organometallic vapor and any particle debris must also be substantially removed. Accordingly, as one example of a useful application of a method of the present description of removing organometallic vapor from a gas mixture, a method as described can be used to remove organometallic vapor from the referenced type of heated exhaust gas mixture.

Referring again to FIG. 2, gas mixture 200 can be a hot exhaust gas as described, flowing in a continuous fashion from process 202, which may be a process of producing light emitting devices (LEDs). Gas mixture 200 may contain ammonia vapor, hydrogen vapor, nitrogen vapor, organometallic vapor, and an amount of solid particles (e.g., microparticles, sub-micron particles, or the like). Gas mixture 200 exits process 202 at an elevated temperature and at or near ambient pressure, e.g., at an ambient flow pressure. The temperature can be as high as 500 degrees Celsius during process 202, but the temperature of gas mixture 200 can be reduced, e.g., to below 200 or below 100 degrees Celsius (such as to a temperature in a range from 50, 60, 70, or 80 to 100 degrees Celsius) before reaching heat exchanger 210.

After exiting process 202, gas mixture 200 passes through each of at least three stages: heat exchanger 210, particle removal filter 214, and organometallic vapor removal filter 218. The illustrated order of passing through each of these steps is to pass through heat exchanger 210 as the first stage, then particle removal filter 214 as a second stage, and then organometallic vapor removal filter 218 as a third stage. However, these steps may be performed in a different order if desired and may also be performed by including one or more additional steps (or stages) performed before, after, or in between any of these three steps. For example, a second particle removal filter capable of removing particles of sizes smaller than the particles removed by upstream particle removal filter 214, may optionally be included before or after vapor removal filter 218 (e.g., as a fourth stage after vapor removal filter 218), to remove any particles (e.g., micron-scale or sub-micron-scale particles) still remaining in a gas mixture after processing by the previous stages.

As shown, the gas mixture exits heat exchanger 210 as cooled gas mixture 212, e.g., having a temperature in a range from 0 to 60, e.g., from 0 to 40 degrees Celsius. Cooled gas mixture 212 enters particle removal filter 214 and exits as filtered gas stream 216 having a reduced level of particles. The cooled gas mixture having reduced particles enters organometallic vapor removal filter 218 (see FIGS. 1 and 6) and exits as gas stream that contains a reduced amount of organometallic vapor.

Gas mixture 220 can be further optionally processed by use of another particle filter, e.g., a microfiltration step as a fourth stage, to remove micron-sized or sub-micron-sized particles, e.g., particles having a particle size of below 6, 5, 4, or 3 microns. Either with or without an additional microfiltration step, gas mixture 220 can next be processed in any desired manner as indicated by process 230. As one example, gas mixture 220 can be processed by process 230 to separate ammonia from the gas mixture.

Figure 3:
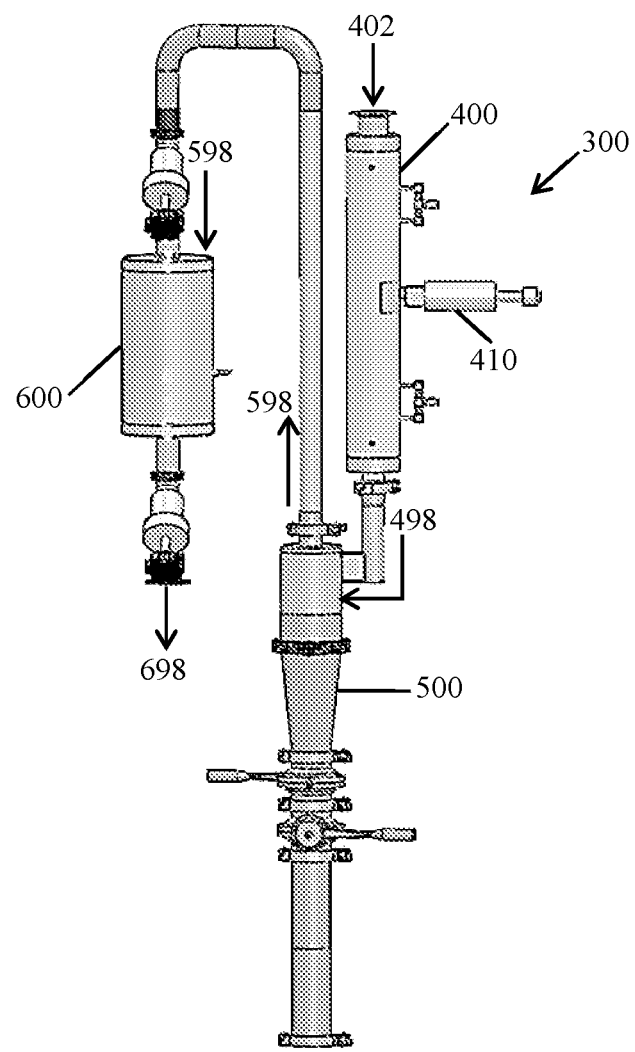
FIG. 3 shows an example of a system or a set of devices or method steps as described, that include using solid adsorbent to remove organometallic vapor from a gas mixture.

FIG. 3 shows specific examples of useful devices of a system such as system 200 of FIG. 2. System 300 includes heat exchanger 400, particle removal filter 500, and organometallic vapor removal filter 600, in that order. As shown, gas mixture 402, e.g., exhaust gas having a temperature of greater than 60 degrees Celsius enters heat exchanger 400, passes through the heat exchanger, and exits the heat exchanger as cooled gas mixture 498, e.g., having a temperature in a range from 0 to 60, e.g. such as from 0 to 40 degrees Celsius. Cooled gas mixture 498 enters particle removal filter 500 where a substantial portion of solid particles is removed from the cooled gas mixture. The gas mixture exits particle removal filter 500 as filtered gas stream 598 having a reduced level of solid particles. The gas mixture having reduced particles enters organometallic vapor removal filter 600 (see, e.g., FIG. 6) and exits as gas stream 698 having a reduced level of particles and organometallic vapor, and a reduced temperature, relative to incoming gas mixture 402.

Also shown at FIG. 3 is oscillator or "vibrator" 410, which attaches between heat exchanger 400 and a solid support (e.g., wall), and vibrates to cause continuous, oscillating or vibrating movement of heat exchanger 400. The nature of the vibration, e.g., the frequency and distance of movement that constitutes the vibration, can be effective to prevent particulate buildup at interior surfaces of heat exchanger 400.

Figure 4:
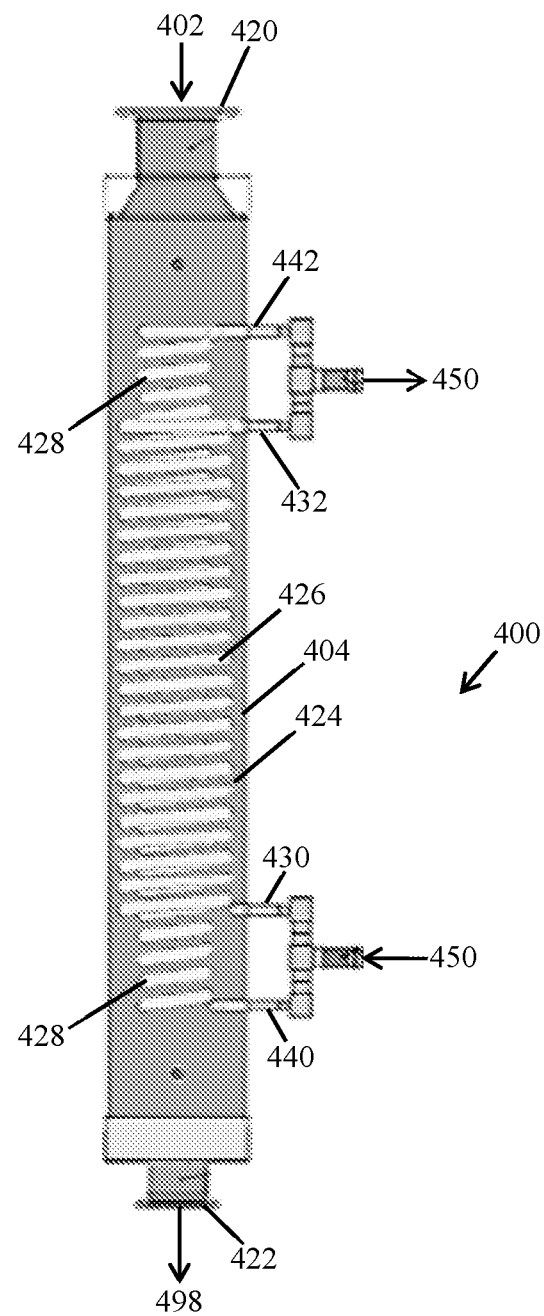
FIG. 4 shows an example of a heat exchanger that may be useful in a system or method as described.

FIG. 4 is a more detailed illustration of an example of a useful heat exchanger 400. As illustrated, heat exchanger 400 is a counterflow coil-type heat exchanger that includes heat exchanger body 404, body inlet 420, body outlet 422, and a body interior volume 424. Further, hollow coil body 426 is located within heat exchanger body interior volume 424 and includes coil inlet 430, coil outlet 432, and multiple coil turns between the coil inlet and the coil outlet. Second hollow coil body 428 is also located within heat exchanger body interior volume 424 and is connected to second coil inlet 440 and second coil outlet 442.

Cooling liquid 450 enters the hollow coil body at the coil inlets, flows through the hollow coil body in a direction opposite of a direction of flow of the heated gas mixture passing through the heat exchanger body, and exits the hollow coil body at the coil outlet. Heated gas mixture 402 enters the heat exchanger body at the body inlet at a first temperature, passes through the interior volume and over exterior surfaces of the hollow coils, and exits the heat exchanger body at the body outlet at a reduced temperature.

Figure 5A:
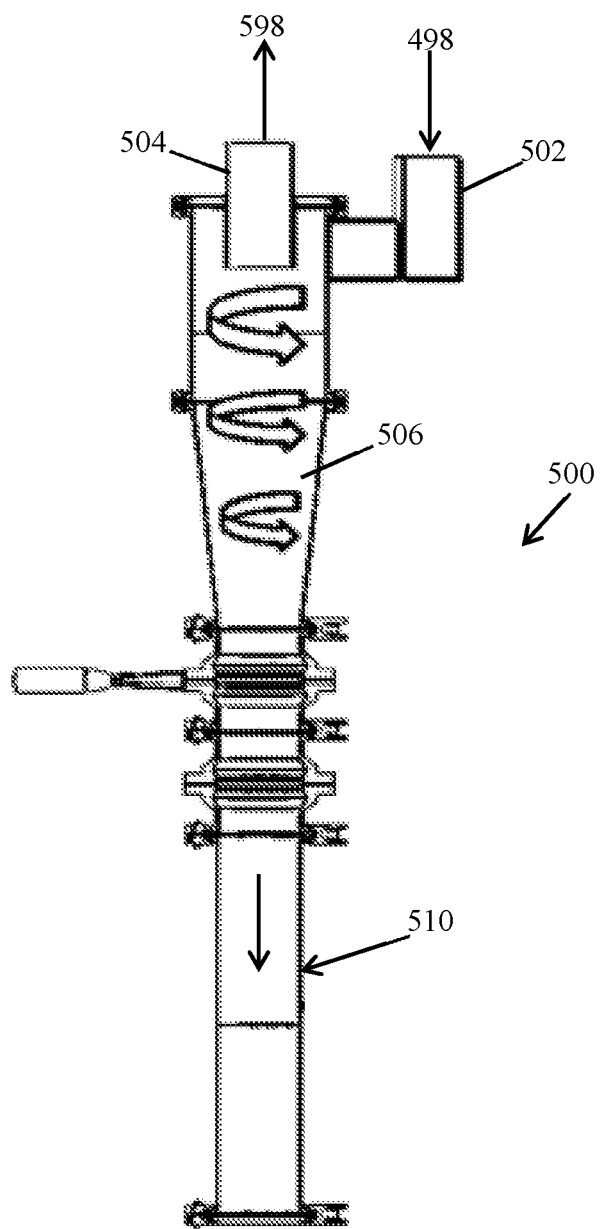
FIGS. 5A and 5B show example particle filters that may be useful in a system or method as described.

FIG. 5A shows a single example of a particle removal filter 500. As illustrated, filter 500 is a cyclonic filter that removes particles from entering gas mixture 498 by circulating gas mixture 498 in a cyclonic flow (shown by the circular arrows) at interior 506 of filter 500. Gas mixture 498 enters filter 500 through inlet 502, passes through conical filter interior 506, and exits as through outlet 504 as gas mixture 598 having a substantial amount of particles being removed. Particles contained in the gas mixture circulating at conical interior 506 are drawn, e.g., by gravity, in a downward direction to particle trap 510 where the particles can exit filter 500 and be removed from the gas mixture. The circulating gas mixture flows in a circular direction, and upward, to exit through outlet 504 while containing a reduced amount of particles.

Figure 5B:
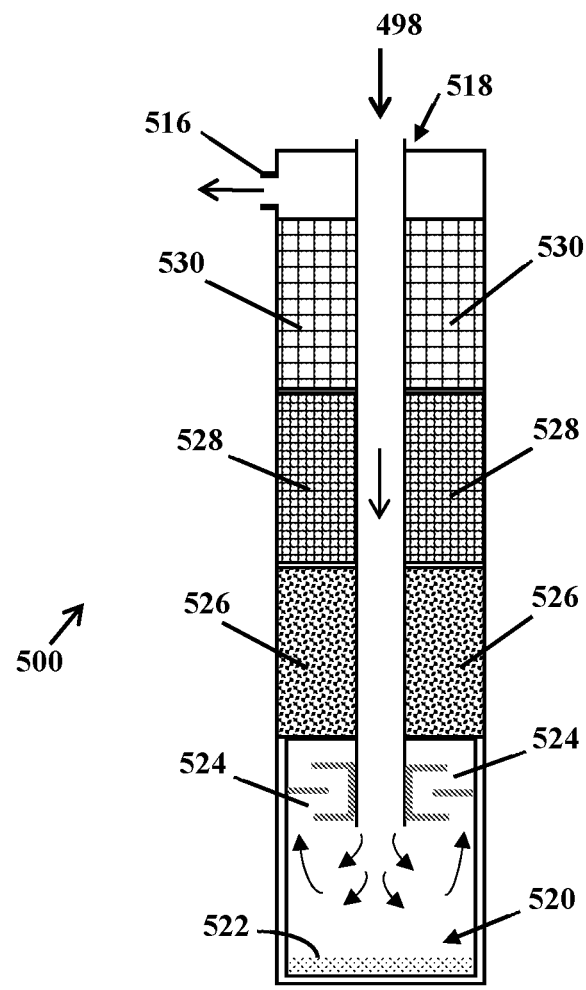

In another embodiment, instead of a cyclonic filter, a filter 500 may be a multi-stage filter that includes one or more of: an impaction stage, a carbon fiber collection stage, a tortuous path (e.g., labyrinth) stage, and a fiber media stage that can be included with or as an alternative to the illustrated cyclonic filter. FIG. 5B shows an example of filter 500 that includes an inlet 518 for gas mixture 498, and an outlet 516 for filtered gas mixture 598. In between the inlet and outlet are multiple filtration stages. A first stage is impaction stage 520, including carbon fiber layer 522 at a bottom of the filter. Gas mixture 498 flows down and contacts (impacts) carbon fiber layer 522, where particles can become captured and entrapped in the carbon fiber layer.

A next stage is "labyrinth" or "tortuous path" stage 524, made using baffles or other physical structures that divert the flow of the gas mixture and are effective to capture, restrict, or restrain the further progress of at least a portion of particles present in the gas mixture as it flows through the tortuous path.

One or more additional filter stages 526, 528, and 530, can include one or more fibrous filter materials effective to allow flow of the gas mixture through the stage, with retention of particles in the fibrous material. The fibrous filter material can be selected to provide good filtering, with good flow of a gas mixture through the filter stage, preferably without impurities being degassed (outgassed) from the fibrous filter material into the gas mixture passing through the fibrous filter material. The fibrous filter material may be any useful material, different varieties of which are generally known, including stainless steel wool, carbon wool, ceramic wool, etc.

A useful filter 500 (e.g., a cyclonic filter, a multi-stage filter, or another type of particle filter) can be effective to remove micro particles having a particle size (in terms of diameter) of below 30, 20, and 10 microns, e.g., to a size of as small as about 5 or 6 microns.

Figure 6:
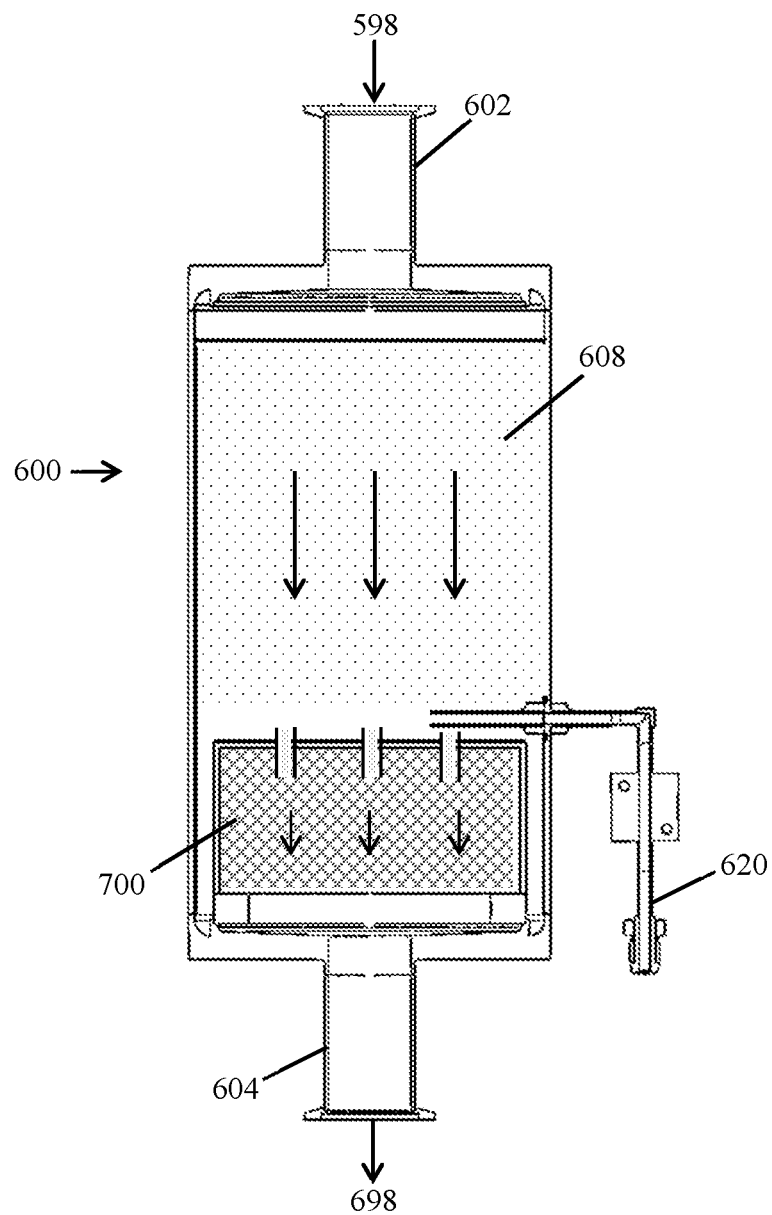
FIG. 6 shows an example of an organometallic vapor removal filter and optional particle filter that may be useful in a system or method as described.

FIG. 6 shows one example of a third and fourth stage of a multi-stage system as described, the example third stage being an example of organometallic vapor removal filter 600, and the example fourth stage being second particle removal filter 700. As illustrated, organometallic vapor removal filter 600 and second particle removal filter 700 are contained in a single structure, filter 600, but these two stages of filtering could instead be contained separately in two different filter structures that allow a gas mixture to be flowed individually through both of the two separate filters.

As illustrated, filter 600 includes inlet 602, outlet 604, and an interior volume that includes first filter bed 608 that contains solid adsorbent and second bed 700 that contains a second particle removal filter. Gas mixture 598 enters filter 600 through inlet 602, passes through first bed 608 and the contained solid adsorbent therein to cause organometallic vapor from the gas stream to adsorb onto the solid adsorbent and be removed from the gas stream. Next the gas mixture enters and passes through second bed 700 and a particle filter contained in the second bed to remove micron-sized or sub-micron-sized particles from the gas stream.

A useful second particle filter 700 can be effective to remove micro particles having a particle size (in terms of diameter) that is smaller than the size of particles removed by a previous particle filter, e.g., a cyclonic filter as illustrated at FIG. 5. For example, a second particle filter 700 can be a capable of microfiltration, to remove micron-sized or sub-micron-sized particles, e.g., particles having a particle size of below 6, 5, 4, 3, 1, 0.5, or 0.1 microns.

Sample port 620 allows for removing a sample of the gas mixture flowing through bed 608 for analytical testing, such as to measure for the presence and amount of organometallic compounds.

In a first aspect, a method of removing gaseous organometallic vapor from a gas mixture that contains the organometallic vapor and non-organometallic vapor comprises passing the gas mixture through solid adsorbent and adsorbing the organometallic vapor onto the solid adsorbent.

A second aspect according to the first aspect is wherein the gas mixture passes through the solid adsorbent at ambient flow pressure and at a temperature in a range from 0 to 50 degrees Celsius.

A third aspect according to any preceding aspect is wherein the non-organometallic vapor comprises one or more of gaseous ammonia, gaseous hydrogen, gaseous nitrogen, and a combination thereof.

A fourth aspect according to any preceding aspect is wherein the organometallic vapor comprises gallium.

A fifth aspect according to any preceding aspect is wherein the organometallic vapor is trimethylgallium.

A sixth aspect according to any preceding aspect is wherein the solid adsorbent is selected from a carbon adsorbent, a zeolite, silica, and alumina.

A seventh aspect according to any preceding aspect is wherein the solid adsorbent has a surface area in a range from 100 to 1500 square meters per gram.

An eight aspect according to any preceding aspect is wherein the solid adsorbent has an average pore size in a range from 3 to 8 angstroms.

In a ninth aspect, a method of filtering a gas mixture that contains organometallic vapor, particles, and non-organometallic vapor comprises: reducing a temperature of the gas mixture by passing the gas mixture through a heat exchanger to produce a cooled gas mixture; passing the cooled gas mixture through a particle filter to remove particles; and passing the cooled gas mixture through solid adsorbent to adsorb organometallic vapor onto the adsorbent.

A tenth aspect according to the ninth aspect is wherein the gas mixture comprises non-organometallic vapor selected from gaseous ammonia, gaseous hydrogen, gaseous nitrogen, and a combination thereof.

An eleventh aspect according to the ninth or tenth aspects is wherein the gas mixture has a temperature greater than 50 degrees Celsius.

A twelfth aspect according to the eleventh aspect further comprises reducing the temperature of the gas mixture to a temperature in a range from 0 to 40 degrees Celsius.

A thirteenth aspect according to any of the ninth through twelfth aspects is wherein the step of reducing the temperature of the gas mixture comprises passing the heated gas mixture through a heat exchanger that includes a cooling element having a cooling liquid flowing through the cooling element, the cooling liquid having an inlet temperature of below 30 degrees Celsius.

A fourteenth aspect according to any of the ninth through thirteenth aspects is wherein the heat exchanger is a counterflow coil heat exchanger comprising: a hollow heat exchanger body comprising a body inlet, a body outlet, and a body interior volume; and a hollow coil body located within the heat exchanger body interior volume and comprising a coil inlet, a coil outlet, and multiple coil turns between the coil inlet and the coil outlet, wherein: the gas mixture enters the hollow heat exchanger body at the body inlet, passes through the interior volume and over an exterior surface of the hollow coil, and exits the hollow heat exchanger body at the body outlet, and the cooling liquid enters the hollow coil body at the coil inlet, flows through the hollow coil body in a direction opposite of a direction of flow of the gas mixture passing through the hollow heat exchanger body, and exits the hollow coil body at the coil outlet.

A fifteenth aspect according to the fourteenth aspect is wherein the heat exchanger comprises: a second hollow coil body located within the heat exchanger body interior volume and comprising a second coil inlet, a second coil outlet, and multiple second coil turns between the second coil inlet and the second coil outlet, wherein: cooling liquid enters the second hollow coil body at the second coil inlet, flows through the second hollow coil body in a direction opposite of a direction of flow of the heated gas mixture passing through the hollow heat exchanger body, and exits the second hollow coil body at the second coil outlet.

A sixteenth aspect according to any of the ninth through fifteenth aspects further comprises vibrating the heat exchanger to prevent organometallic material from collecting on interior surfaces of the heat exchanger.

A seventeenth aspect according to any of the ninth through sixteenth aspects is wherein the heated gas mixture comprises: from 15 to 40 volume percent gaseous ammonium, from 0 to 60 volume percent gaseous hydrogen, from 0 to 70 volume percent gaseous nitrogen, and organometallic compound.

An eighteenth aspect according to the seventeenth aspect is wherein the organometallic compound is trimethyl gallium.

A nineteenth aspect according to any of the ninth through eighteenth aspects is wherein the gas mixture comprises ammonia and the method further comprises, after removing particles from the cooled gas mixture and after removing organometallic vapor from the cooled gas mixture, recovering ammonia from the cooled gas mixture.

In a twentieth aspect, a system for filtering a gas mixture that contains organometallic vapor, particles, and non-organometallic vapor comprises a heat exchanger, a particle filter, and a solid adsorbent arranged to allow flow of the gas mixture through the heat exchanger to cool the gas mixture, through the particle filter to remove particles from the gas mixture, and through the solid adsorbent to remove organometallic vapor form the gas mixture.

A twenty first aspect of the twentieth aspect is wherein the heat exchanger is a counterflow coil heat exchanger comprising: a hollow heat exchanger body comprising a body inlet, a body outlet, and a body interior volume; and a hollow coil body located within the heat exchanger body interior volume and comprising a coil inlet, a coil outlet, and multiple coil turns between the coil inlet and the coil outlet, wherein: the gas mixture enters the hollow heat exchanger body at the body inlet, passes through the interior volume and over an exterior surface of the hollow coil, and exits the hollow heat exchanger body at the body outlet, and the cooling liquid enters the hollow coil body at the coil inlet, flows through the hollow coil body in a direction opposite of a direction of flow of the gas mixture passing through the hollow heat exchanger body, and exits the hollow coil body at the coil outlet.

A twenty second aspect of the twenty first aspect is wherein the heat exchanger comprises: a second hollow coil body located within the heat exchanger body interior volume and comprising a second coil inlet, a second coil outlet, and multiple second coil turns between the second coil inlet and the second coil outlet, wherein: cooling liquid enters the second hollow coil body at the second coil inlet, flows through the second hollow coil body in a direction opposite of a direction of flow of the gas mixture passing through the hollow heat exchanger body, and exits the second hollow coil body at the second coil outlet.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. Changes may be made in the details, particularly in matters of shape, size, and arrangement of parts without exceeding the scope of the disclosure. The disclosure's scope is, of course, defined in the language in which the appended claims are expressed.

What is claimed is:

1. A system for filtering a gas mixture comprising organometallic vapor, particles, and non-organometallic vapor, the system comprising:
    a heat exchanger,
    a particle filter, and
    a solid adsorbent,
    the system arranged to allow flow of the gas mixture through the heat exchanger to cool the gas mixture, through the particle filter to remove particles from the gas mixture, and through the solid adsorbent to remove organometallic vapor from the gas mixture;
    wherein the heat exchanger is a counterflow coil heat exchanger comprising:
        a heat exchanger body comprising a body inlet, a body outlet, and a body interior volume, and
        a hollow coil body located within the heat exchanger body interior volume and comprising a coil inlet, a coil outlet, and multiple coil turns between the coil inlet and the coil outlet, wherein:
        the gas mixture enters the heat exchanger body at the body inlet, flows through the interior volume and over an exterior surface of the hollow coil, and exits the heat exchanger body at the body outlet, and
        a cooling liquid enters the hollow coil body at the coil inlet, flows through the hollow coil body in a direction opposite of a direction of flow of the gas mixture passing through the heat exchanger body, and exits the hollow coil body at the coil outlet.

2. The system of claim 1, wherein the heat exchanger comprises: a second hollow coil body located within the heat exchanger body interior volume and comprising a second coil inlet, and multiple second coil turns between the second coil inlet and the second coil outlet, wherein: cooling liquid enters the second hollow coil body at the second coil inlet, flows through the second hollow coil body in a direction opposite of a direction of flow of the gas mixture passing through the hollow heat exchanger body, and exits the second hollow coil body at the second coil outlet.

3. The system of claim 1, wherein the particle filter comprises a cyclonic filter.

4. The system of claim 1, wherein the particle filter comprises a multi-stage filter.

5. The system of claim 4, wherein the multi-stage filter comprises:
   an impaction stage;
   a carbon fiber collection stage;
   a tortuous path stage; and
   a fiber media stage.

6. The system of claim 1, wherein the solid adsorbent has a surface area in a range from 100 to 1500 square meters per gram.

7. The system of claim 1, wherein the solid adsorbent has an average pore size below 150 angstroms.

8. The system of claim 1, wherein the solid adsorbent has an average pore size in a range from 3 angstroms to 8 angstroms.

9. A system for filtering a gas mixture comprising organometallic vapor, particles, and non-organometallic vapor, the system comprising:
   a heat exchanger,
   a particle filter, and
   a solid adsorbent,
   the system arranged to allow flow of the gas mixture
      through the heat exchanger to cool the gas mixture, through the particle filter to remove particles from the gas mixture, and through the solid adsorbent to remove organometallic vapor from the gas mixture;
   wherein the particle filter comprises a multi-stage filter comprising:
      an impaction stage,
      a carbon fiber collection stage,
      a tortuous path stage, and
      a fiber media stage.

10. The system of claim 9, wherein the particle filter comprises a cyclonic filter.

11. The system of claim 9, wherein the solid adsorbent has a surface area in a range from 100 to 1500 square meters per gram.

12. The system of claim 9, wherein the solid adsorbent has an average pore size below 150 angstroms.

13. The system of claim 9, wherein the solid adsorbent has an average pore size in a range from 3 angstroms to 8 angstroms.

* * * * *